US011809075B2

(12) United States Patent
Shih et al.

(10) Patent No.: US 11,809,075 B2
(45) Date of Patent: *Nov. 7, 2023

(54) EUV LITHOGRAPHY MASK WITH A POROUS REFLECTIVE MULTILAYER STRUCTURE

(71) Applicant: Taiwan Semiconductor Manufacturing Co., Ltd., Hsinchu (TW)

(72) Inventors: Chih-Tsung Shih, Hsinchu (TW); Shih-Chang Shih, Hsinchu (TW); Li-Jui Chen, Hsinchu (TW); Po-Chung Cheng, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 94 days.

This patent is subject to a terminal disclaimer.

(21) Appl. No.: 17/394,005

(22) Filed: Aug. 4, 2021

(65) Prior Publication Data

US 2021/0364907 A1 Nov. 25, 2021

Related U.S. Application Data

(63) Continuation of application No. 15/798,937, filed on Oct. 31, 2017, now Pat. No. 11,086,209.
(Continued)

(51) Int. Cl.
*G03F 1/24* (2012.01)
*G03F 1/52* (2012.01)
(Continued)

(52) U.S. Cl.
CPC ................. *G03F 1/24* (2013.01); *G03F 1/52* (2013.01); *G03F 1/54* (2013.01); *G03F 1/80* (2013.01)

(58) Field of Classification Search
CPC ................. G03F 1/24; G03F 1/52; G03F 1/80
See application file for complete search history.

(56) References Cited

U.S. PATENT DOCUMENTS

| 6,449,086 B1 | 9/2002 | Singh |
| 8,628,897 B1 | 1/2014 | Lu et al. |

(Continued)

FOREIGN PATENT DOCUMENTS

| TW | 200632587 A | 9/2006 |
| TW | 200832079 A | 8/2008 |

(Continued)

OTHER PUBLICATIONS

Singh, J.P., et al. "Physical Properties of Nanostructures Grown by Oblique Angle Deposition", J. Vac. Sci. Technol. B, vol. 23, No. 5, pp. 2114-2121 (2005).

*Primary Examiner* — Daborah Chacko-Davis
(74) *Attorney, Agent, or Firm* — HAYNES AND BOONE, LLP

(57) ABSTRACT

A lithography mask includes a substrate that contains a low thermal expansion material (LTEM). The lithography mask also includes a reflective structure disposed over the substrate. The reflective structure includes a first layer and a second layer disposed over the first layer. At least the second layer is porous. The mask is formed by forming a multilayer reflective structure over the LTEM substrate, including forming a plurality of repeating film pairs, where each film pair includes a first layer and a porous second layer. A capping layer is formed over the multilayer reflective structure. An absorber layer is formed over the capping layer.

20 Claims, 6 Drawing Sheets

Related U.S. Application Data

(60) Provisional application No. 62/490,874, filed on Apr. 27, 2017.

(51) Int. Cl.
  *G03F 1/80* (2012.01)
  *G03F 1/54* (2012.01)

(56) References Cited

U.S. PATENT DOCUMENTS

| | | | |
|---|---|---|---|
| 8,679,707 B2 | 3/2014 | Lee et al. |
| 8,691,476 B2 | 4/2014 | Yu et al. |
| 8,709,682 B2 | 4/2014 | Chen et al. |
| 8,715,890 B2 | 5/2014 | Tu et al. |
| 8,722,286 B2 | 5/2014 | Yu et al. |
| 8,753,788 B1 | 6/2014 | Yu et al. |
| 8,764,995 B2 | 7/2014 | Chang et al. |
| 8,765,330 B2 | 7/2014 | Shih et al. |
| 8,765,582 B2 | 7/2014 | Hsu et al. |
| 8,785,084 B2 | 7/2014 | Lu et al. |
| 8,828,625 B2 | 9/2014 | Lu et al. |
| 8,841,047 B2 | 9/2014 | Yu et al. |
| 8,877,409 B2 | 11/2014 | Hsu et al. |
| 11,086,209 B2 * | 8/2021 | Shih ............... G03F 1/80 |
| 2006/0076516 A1 | 4/2006 | Wedowski |
| 2009/0263730 A1 | 10/2009 | Kim |
| 2011/0164237 A1 | 7/2011 | Soer et al. |
| 2013/0202992 A1 | 8/2013 | Chen et al. |
| 2015/0286146 A1 | 10/2015 | Chang et al. |
| 2015/0309405 A1 | 10/2015 | Shih et al. |
| 2015/0311075 A1 | 10/2015 | Huang et al. |
| 2016/0004153 A1 | 1/2016 | Shoki et al. |
| 2016/0033866 A1 | 2/2016 | Lu et al. |
| 2016/0349610 A1 | 12/2016 | Hsu et al. |
| 2018/0173090 A1 | 6/2018 | Wang et al. |
| 2018/0314144 A1 | 11/2018 | Shih et al. |

FOREIGN PATENT DOCUMENTS

| | | |
|---|---|---|
| TW | 201134775 A | 10/2011 |
| TW | 201223889 A | 6/2012 |

* cited by examiner

EUV LITHOGRAPHY MASK WITH A POROUS REFLECTIVE MULTILAYER STRUCTURE

PRIORITY DATA

This application is a continuation of U.S. patent application Ser. No. 15/798,937, filed Oct. 31, 2017, which claims priority to U.S. Provisional Patent Application No. 62/490,874, filed Apr. 27, 2017, and entitled "Photonic Crystal Multilayer for EUV Mask and Method of Making the Same," the disclosures of which are hereby incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

The EUVL employs scanners using light in the extreme ultraviolet (EUV) region, having a wavelength of about 1-100 nanometers (nm). Some EUV scanners provide 4× reduction projection printing, similar to some optical scanners, except that the EUV scanners use reflective rather than refractive optics, i.e., mirrors instead of lenses. EUV scanners provide the desired pattern on an absorption layer ("EUV" mask absorber) formed on a reflective mask. Currently, binary intensity masks (BIM) are employed in EUVL for fabricating integrated circuits. EUVL is very similar to optical lithography in that it needs a mask to print wafers, except that it employs light in the EUV region, i.e., at 13.5 nm. At the wavelength of 13.5 nm or so, all materials are highly absorbing. Thus, reflective optics rather than refractive optics is used. A multi-layered (ML) structure is used as a EUV mask blank.

Despite the increasing popularity of EUVL, however, conventional EVU masks and the fabrication thereof may still have drawbacks. For example, the EVU mask has a multilayer reflective structure. The multilayer reflective structure for conventional EUV masks has not been able to simultaneously produce a high refractive index and a low absorption index. The multilayer reflective structure for conventional EUV masks may also suffer from undesirable inter-diffusion between the film pairs in the multilayer reflective structure.

Therefore, while EUV lithography systems and processes have been generally adequate for their intended purposes, they have not been entirely satisfactory in every aspect. What is needed is a EUV lithography method system to address the above issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
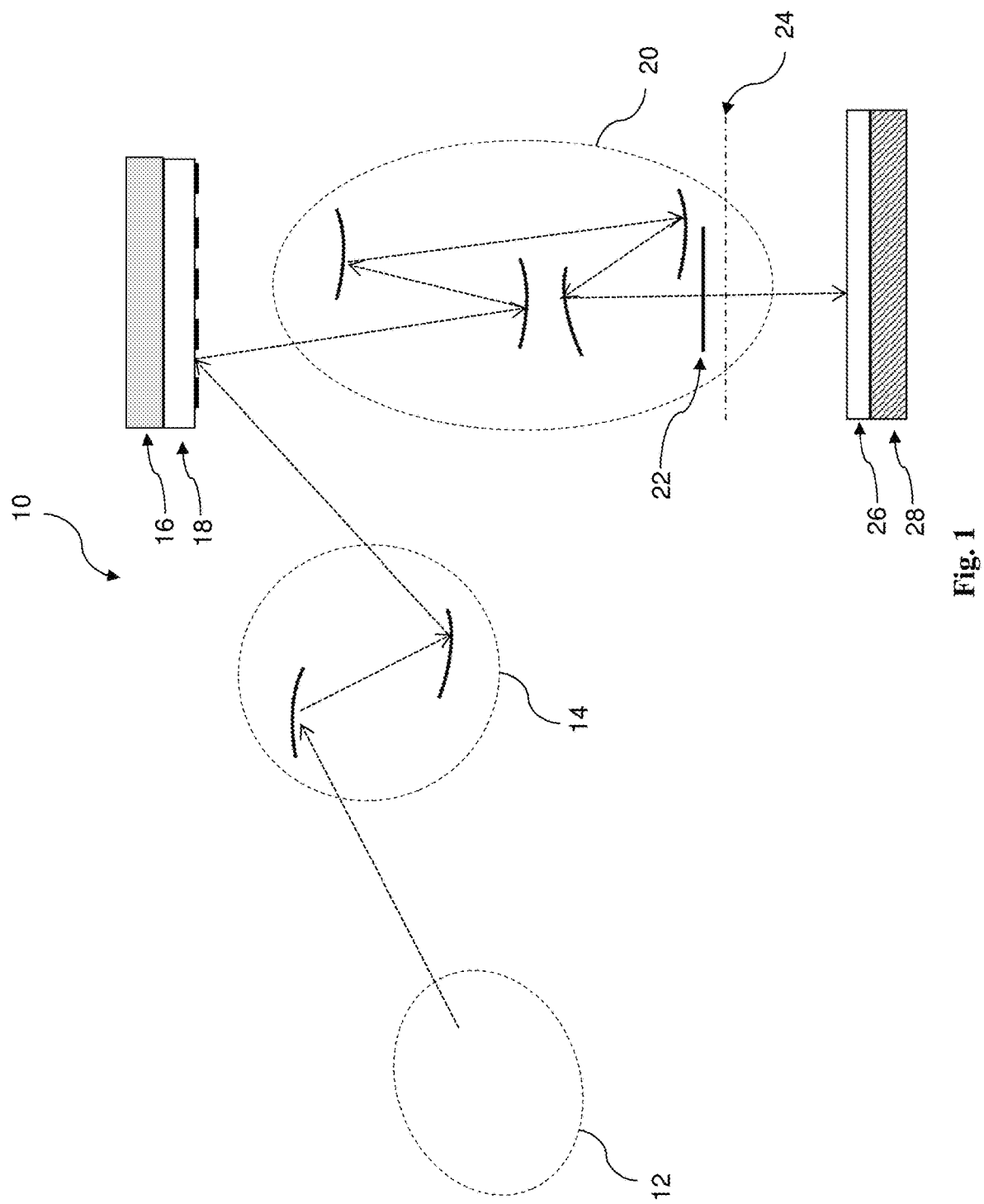
FIG. 1 is a schematic view of a lithography system constructed in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Extreme ultraviolet (EUV) lithography has become widely used due to its ability to achieve small semiconductor device sizes. However, conventional systems and methods of performing EUV lithography may still have shortcomings. For example, EUV systems employ a lithography mask configured to perform EUV lithography. Such EUV lithography masks typically include a multilayer reflective structure made of a plurality of film pairs to reflect the EUV radiation. To optimize the performance of the reflective structure, it is desirable to have a material (for one of the layers in each of the film pairs) that has a high refractive index (e.g., substantially equal to 1) and a low absorption coefficient (e.g., substantially equal to 0). In addition, it is desirable to reduce the inter-diffusion between the layers in the film pairs. However, conventional EUV reflective structures have not been able to meet all of the above conditions. As such, the performance of conventional EUV lithography masks has not been optimized.

To overcome the problems discussed above, the present disclosure provides a lithography mask (and a method of fabricating the same) that has a porous multilayer reflective structure. The porous multilayer reflective structure can effective serve as a material that simultaneously has a high refractive index (e.g., substantially equal to 1) and a low absorption coefficient (e.g., substantially equal to 0). The porous multilayer reflective structure also reduces the inter-diffusion between the layers in the film pairs. The various aspects of the present disclosure will be discussed below in greater detail with reference to FIGS. 1-6. First, a EUV lithography system will be discussed below with reference to FIGS. 1-2. Next, the details of a reflective multilayer structure and a method of manufacturing the same according to embodiments of the present disclosure will be discussed with reference to FIGS. 3-6.

FIG. 1 is a schematic view diagram of a EUV lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by EUV light or EUV radiation. The photoresist layer is a material sensitive to the EUV light. The EUV lithography system 10 employs a radiation source 12 to generate EUV light, such as EUV light having a wavelength ranging between about 1 nm and about 100 nm. In one particular example, the radiation source 12 generates a EUV light with a wavelength centered at about 13.5 nm. Accordingly, the radiation source 12 is also referred to as EUV radiation source 12.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16, particularly to a mask 18 secured on the mask stage 16. In the present embodiment where the radiation source 12 generates light in the EUV wavelength range, the illuminator 14 employs reflective optics. In some embodiments, the illuminator 14 includes a dipole illumination component.

In some embodiments, the illuminator 14 is operable to configure the mirrors to provide a proper illumination to the mask 18. In one example, the mirrors of the illuminator 14 are switchable to reflect EUV light to different illumination positions. In some embodiment, a stage prior to the illuminator 14 may additionally include other switchable mirrors that are controllable to direct the EUV light to different illumination positions with the mirrors of the illuminator 14. In some embodiments, the illuminator 14 is configured to provide an on-axis illumination (ONI) to the mask 18. In an example, a disk illuminator 14 with partial coherence σ being at most 0.3 is employed. In some other embodiments, the illuminator 14 is configured to provide an off-axis illumination (OAI) to the mask 18. In an example, the illuminator 14 is a dipole illuminator. The dipole illuminator has a partial coherence σ of at most 0.3 in some embodiments.

The lithography system 10 also includes a mask stage 16 configured to secure a mask 18. In some embodiments, the mask stage 16 includes an electrostatic chuck (e-chuck) to secure the mask 18. This is because gas molecules absorb EUV light, and the lithography system for the EUV lithography patterning is maintained in a vacuum environment to avoid the EUV intensity loss. In the disclosure, the terms of mask, photomask, and reticle are used interchangeably to refer to the same item.

In the present embodiment, the lithography system 10 is a EUV lithography system, and the mask 18 is a reflective mask. One exemplary structure of the mask 18 is provided for illustration. The mask 18 includes a substrate with a suitable material, such as a low thermal expansion material (LTEM) or fused quartz. In various examples, the LTEM includes $TiO_2$ doped $SiO_2$, or other suitable materials with low thermal expansion. In some embodiments, the LTEM includes 5%-20% by weight $TiO_2$ and has a thermal coefficient of expansion lower than about $1.0 \times 10^{-6}/°$ C. For example, in some embodiments, the $TiO_2$ doped $SiO_2$ material of the LTEM has a coefficient thermal expansion such that it varies by less than 60 parts-per-billion for every 1 degree Celsius of temperature change. Of course, other suitable materials having thermal coefficient of expansion that is equal to or less than $TiO_2$ doped $SiO_2$ may also be used.

The mask 18 also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 18 may further include a capping layer, such as ruthenium (Ru), disposed on the ML for protection. The mask 18 further includes an absorption layer deposited over the ML. The absorption layer is patterned to define a layer of an integrated circuit (IC). Alternatively, another reflective layer may be deposited over the ML and is patterned to define a layer of an integrated circuit, thereby forming a EUV phase shift mask.

The lithography system 10 also includes a projection optics module (or projection optics box (POB) 20 for imaging the pattern of the mask 18 on to a semiconductor substrate 26 secured on a substrate stage 28 of the lithography system 10. The POB 20 has refractive optics (such as for UV lithography system) or alternatively reflective optics (such as for EUV lithography system) in various embodiments. The light directed from the mask 18, diffracted into various diffraction orders and carrying the image of the pattern defined on the mask, is collected by the POB 20. The POB 20 may include a magnification of less than one (thereby the size of the "image" on a target (such as target 26 discussed below) is smaller than the size of the corresponding "object" on the mask). The illuminator 14 and the POB 20 are collectively referred to as an optical module of the lithography system 10.

The lithography system 10 also includes a pupil phase modulator 22 to modulate optical phase of the light directed from the mask 18 so that the light has a phase distribution on a projection pupil plane 24. In the optical module, there is a plane with field distribution corresponding to Fourier Transform of the object (the mask 18 in the present case). This plane is referred to as projection pupil plane. The pupil phase modulator 22 provides a mechanism to modulate the optical phase of the light on the projection pupil plane 24. In some embodiments, the pupil phase modulator 22 includes a mechanism to tune the reflective mirrors of the POB 20 for phase modulation. For example, the mirrors of the POB 20 are switchable and are controlled to reflect the EUV light, thereby modulating the phase of the light through the POB 20.

In some embodiments, the pupil phase modulator 22 utilizes a pupil filter placed on the projection pupil plane. A pupil filter filters out specific spatial frequency components of the EUV light from the mask 18. Particularly, the pupil filter is a phase pupil filter that functions to modulate phase distribution of the light directed through the POB 20. However, utilizing a phase pupil filter is limited in some lithography system (such as an EUV lithography system) since all materials absorb EUV light.

As discussed above, the lithography system 10 also includes the substrate stage 28 to secure a target 26 to be patterned, such as a semiconductor substrate. In the present embodiment, the semiconductor substrate is a semiconductor wafer, such as a silicon wafer or other type of wafer. The target 26 (such as substrate) is coated with the resist layer sensitive to the radiation beam, such as EUV light in the present embodiment. Various components including those described above are integrated together and are operable to perform lithography exposing processes. The lithography system 10 may further include other modules or be integrated with (or be coupled with) other modules.

The mask 18 and the method making the same are further described in accordance with some embodiments. In some embodiments, the mask fabrication process includes two operations: a blank mask fabrication process and a mask patterning process. During the blank mask fabrication process, a blank mask is formed by deposing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

The mask 18 includes a suitable structure, such as a binary intensity mask (BIM) and phase-shifting mask (PSM) in various embodiments. An example BIM includes absorptive regions (also referred to as opaque regions) and reflective regions, patterned to define an IC pattern to be transferred to the target. In the opaque regions, an absorber is present, and an incident light is almost fully absorbed by the absorber. In the reflective regions, the absorber is removed and the incident light is diffracted by a multilayer (ML). The PSM can be an attenuated PSM (AttPSM) or an alternating PSM (AltPSM). An exemplary PSM includes a first reflective layer (such as a reflective ML) and a second reflective layer patterned according to an IC pattern. In some examples, an AttPSM usually has a reflectivity of 2%-15% from its absorber, while an AltPSM usually has a reflectivity of larger than 50% from its absorber.

Figure 2:
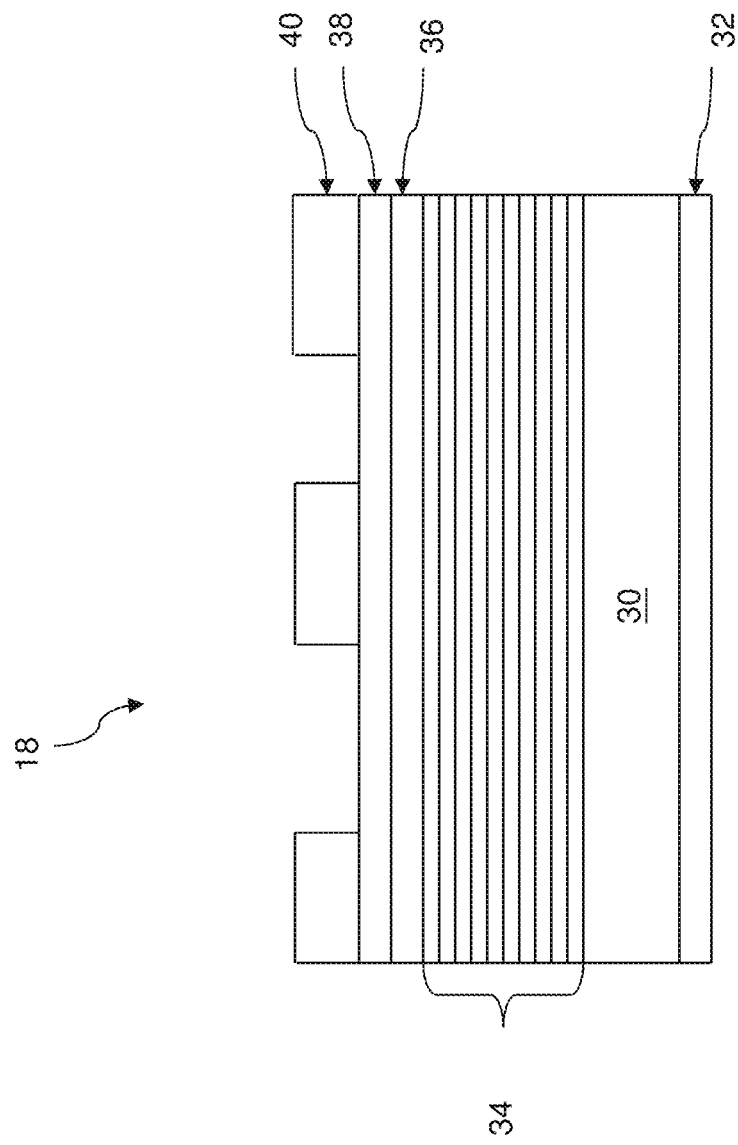
FIG. 2 is a sectional view of an EUV mask constructed in accordance with some embodiments of the present disclosure.

One example of the mask 18 is shown in FIG. 2. The mask 18 in the illustrated embodiment is a EUV mask, and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN). In other embodiments, other suitable compositions are possible, such as a tantalum-containing material.

The EUV mask 18 includes a reflective multilayer structure 34 disposed over the LTEM substrate 30. The reflective multilayer structure 34 may be selected such that it provides a high reflectivity to a selected radiation type/wavelength. The reflective multilayer structure 34 includes a plurality of film pairs, such as Mo/Si film pairs (e.g., a layer of molybdenum above or below a layer of silicon in each film pair). Alternatively, the reflective multilayer structure 34 may include Mo/Be film pairs, or any materials with refractive index difference being highly reflective at EUV wavelengths.

Still referring to FIG. 2, the EUV mask 18 also includes a capping layer 36 disposed over the reflective multilayer structure 34 to prevent oxidation of the ML. In one embodiment, the capping layer 36 includes silicon with a thickness ranging from about 4 nm to about 7 nm. The EUV mask 18 may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 18 also includes an absorber layer 40 (also referred to as an absorption layer) formed over the buffer layer 38. In some embodiments, the absorber layer 40 absorbs the EUV radiation directed onto the mask. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actium, Radium, Tellurium, Zinc, Copper, and Aluminum.

Figure 3:
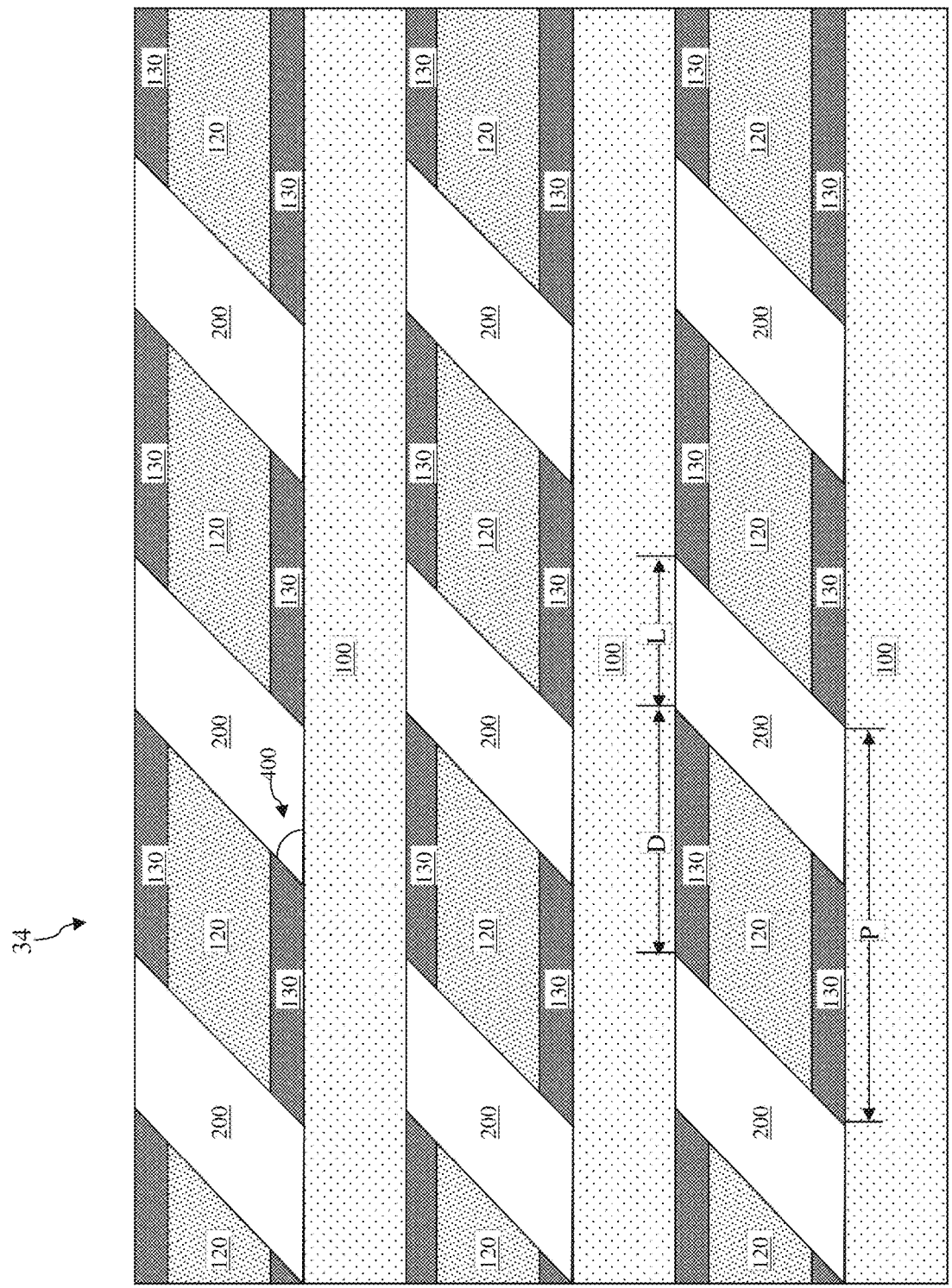
FIG. 3 is a diagrammatic cross-sectional side view of a portion of a multilayer reflective structure of the EUV mask in accordance with some embodiments of the present disclosure.
Figure 4:
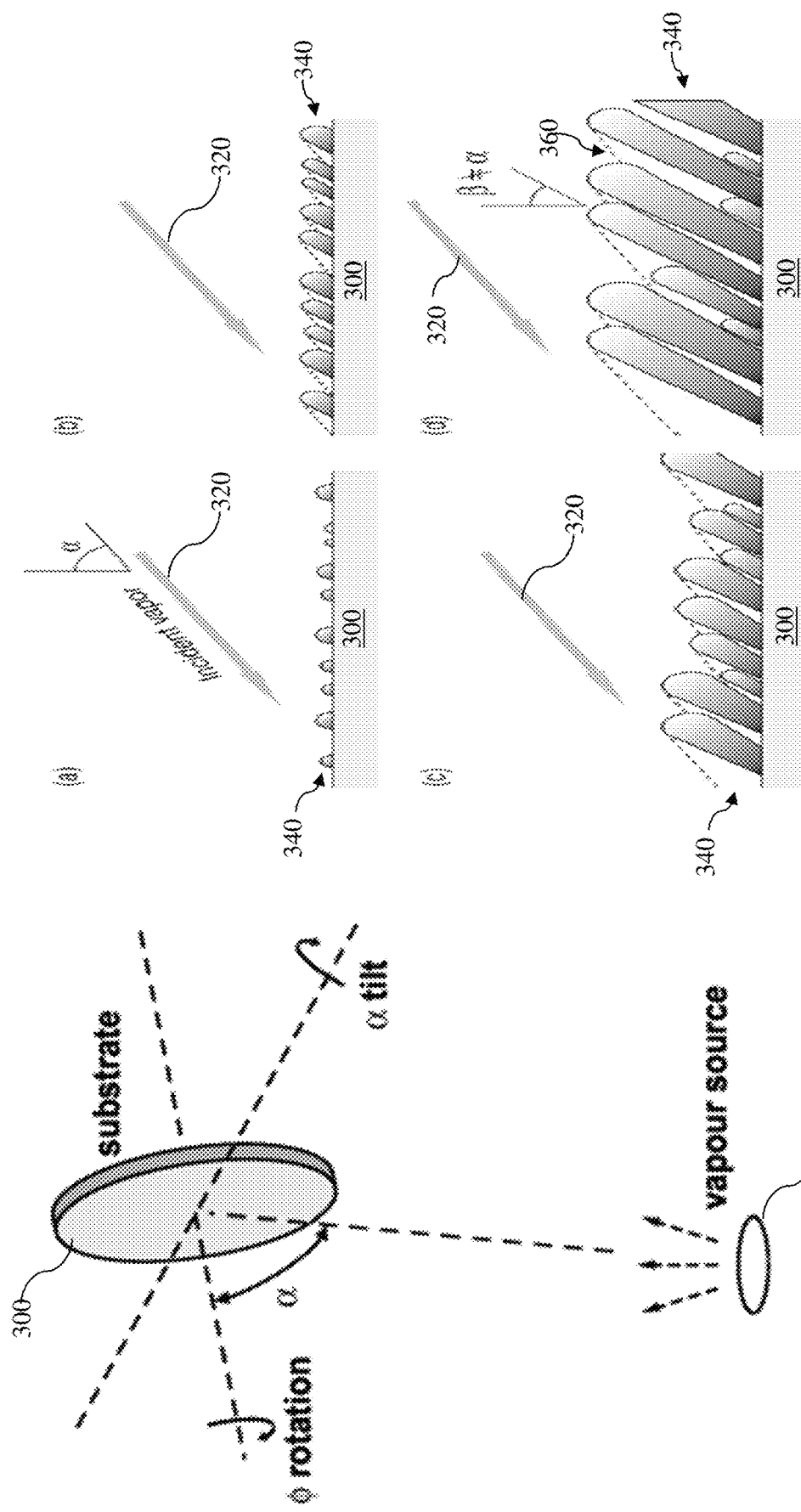
FIG. 4A illustrates a Glancing Angle Deposition (GLAD) technique in accordance with some embodiments of the present disclosure.
FIG. 4B illustrates how a material is formed over a substrate via the GLAD technique in accordance with some embodiments of the present disclosure.

FIG. 3 is a diagrammatic fragmentary cross-sectional side view of a portion of a multilayer reflective structure of a lithography mask according to embodiments of the present disclosure. In the illustrated embodiment, the lithography mask may be an EUV mask such as the EUV mask 18 discussed above with reference to FIGS. 1-2, and FIG. 3 illustrates a portion of the reflective multilayer structure 34 of the EUV mask 18.

As discussed above, the reflective multilayer structure 34 may have a plurality of repeating film pairs. In the illustrated embodiment, each film pair includes a layer 100 and a layer 120. In some embodiments, the layer 100 includes molybdenum, and the layer 120 includes silicon. In other embodiments, the layer 120 need not include silicon, as long as its refractive index is close to 1, for example within a few percentage points of 1. The portion of the reflective multilayer structure 34 shown in FIG. 3 illustrates merely three of such film pairs for reasons of simplicity, but it is understood that the reflective multilayer structure 34 includes many more of such film pairs, for example 40 film pairs in some embodiments. Also as shown in FIG. 3, silicide layers 130 are formed at the interfaces between the layer 100 and the layer 120. For example, a molybdenum silicide (MoSi$_2$) layer is formed above and below each of the layers 120. The silicide layers 130 have substantially smaller thicknesses than the layers 100 and 120.

According to the various aspects of the present disclosure, the layer 120 is made to be porous in order to increase its refractive index, decrease its absorption coefficient, and reduce inter-diffusion between the layers 100 and 120. In more detail, a plurality of pores or voids 200 is formed in the layer 120. In some embodiments, the pores or voids 200 extend vertically through the layer 120, as well as through the silicide layers 130 above and below the layer 120, but the layer 100 is free of the pores or voids 200.

The pores or voids 200 effectively transform the layer 120 into a porous layer, which may have a higher refractive index and a lower absorption coefficient than a non-porous layer. This is because voids—such as vacuum, or even air—may have a refractive index that is substantially equal to 1 and an absorption coefficient that is substantially equal to 0. The layer 120 (e.g., silicon) usually has a refractive index that is lower than 1 and an absorption coefficient that is greater than 0. As such, by effectively transforming the layer 120 into a mixture of the material of the layer 120 and the voids 200, the refractive index of the resulting porous layer is increased, and the absorption coefficient of the resulting porous layer is decreased. In addition, the presence of the voids 200 means that there is a smaller interface between the layers 100 and 120. Due to the smaller interface, undesirable inter-diffusion between the layers 100 and 120 is also reduced.

In some embodiments, the voids 200 are formed via a Glancing Angle Deposition (GLAD) process, the details of which are illustrated in FIGS. 4A and 4B as an example. In more detail, FIG. 4A illustrates a system for performing the Glancing Angle Deposition technique. A substrate 300 is placed over a vapour source 310. The substrate 300 can be rotated with an angle φ. The substrate 300 can also be tilted with a tilt angle α. As the substrate 300 is rotated and/or tilted, the vapour source 310 can deposit a desired material on the substrate, as shown in the steps (a)-(d) of FIG. 4B. For example, due to the tilt angle α of the substrate 300, incident vapor 320 (released by the vapour source 310) also forms the angle α with respect to the surface of the substrate 300.

As shown in steps (a), (b), (c), and (d) of FIG. 4B, the incident vapor 320 deposits a material 340 over the substrate 300. The steps (a), (b), (c), and (d) illustrate the progress of the deposition in a chronological order. It can be seen that due to the angle α by which the incident vapor 320 is deposited onto the substrate 300, gaps or voids 360 are formed or trapped within the deposited material 340. These voids 360 may form the voids 200 discussed above with reference to FIG. 3. Note that the deposited material 340 (or at least a side edge thereof) may also have a slant angle β with respect to the surface of the substrate 300, such as shown in the last step (d) of FIG. 4B. However, it is understood that the angle β and the angle α not necessarily equal to one another.

Referring back to FIG. 3, in the formation of the reflective multilayer structure 34, each of the layers 120 is formed using GLAD with a tilt angle, followed by a formation of the layer 100 without a tilt angle. Therefore, although the layer 120 is formed to have the voids 200 (each with a slant angle 400), the layers 100 are formed to be substantially void-free. As shown in FIG. 3, the voids 200 are formed to be tilted or slanted due to the GLAD technique. For example, for each of the voids 200, the side edge of the void 200 and the upper surface of the layer 100 together define a slant angle 400. The slant angle 400 may be substantially similar to the angle β discussed above in association with FIG. 4B. In some embodiments, the angle 400 is in a range between about 20 degrees and about 70 degrees.

In some embodiments, the voids 200 are also formed to have a periodic distribution. In other words, the voids 200 are substantially uniformly or evenly distributed throughout each of the layers 120. Due to the periodic distribution, a pitch P may be defined as a sum of: a lateral dimension L of the void 200 and a lateral dimension D of a segment of the layer 120. Note that D may also represent a lateral dimension of a segment of the layer 130. In some embodiments, the pitch P is in a range from about 5 nanometers to about 20 nanometers. A porosity (or a porous ratio) of the layer 120 may be defined by the lateral dimension L of the void 200 divided by the pitch P. Stated differently, a porosity (or porous ratio) of the layer 120=L/P.

In some embodiments, the porosity of the layer 120 is in a range from about 20% to about 90%. In some embodiments, the porosity of the layer 120 is in a range from about 40% to about 80%. It is understood that the ranges of the pitch P and the porosity of the layer 120 are not randomly chosen but are specifically configured to optimize the refractive index (e.g., increasing it) and the absorption coefficient (e.g., decreasing it), and to also reduce the inter-diffusion between the layers 100 and 120. For example, if the porosity is configured to be too small, then it may not be able to serve its purpose (increase the refractive index, decrease the absorption coefficient, and reduce the inter-diffusion) as much. On the other hand, if the porosity is configured to be too large, then the layer 100 formed over the layer 120 may either partially or completely fill one or more of the voids 200, thereby interfering with the functions of the voids 200. The ranges disclosed herein are specifically configured to substantially avoid these problems and to optimize the performance of the porous layer 120.

It is understood that although the embodiment of the reflective multilayer structure 34 discussed above with reference to FIG. 3 pertain to using a GLAD technique to cause the reflective multilayer structure 34 to be formed in a porous manner, GLAD is not the only technique that can form a porous structure. In other embodiments, ion beams and/or etching may also be used to form a porous structure. These alternative embodiments of forming a porous structure may still yield a similar structure as the one described above, for example with a diffusion layer 130, a silicon layer 120, air gaps or voids 200, or a low refractive index layer such as molybdenum. It is also understood that the porous structure shown in FIG. 3 represents a more ideal version of the porous structure, and the porous structure shown in FIG. 4B represents a more arbitrary version of the porous structure. In any case, the voids 200 may still be slanted or angled, regardless of whether the porous structure is more ideal or more arbitrary.

Figure 5:
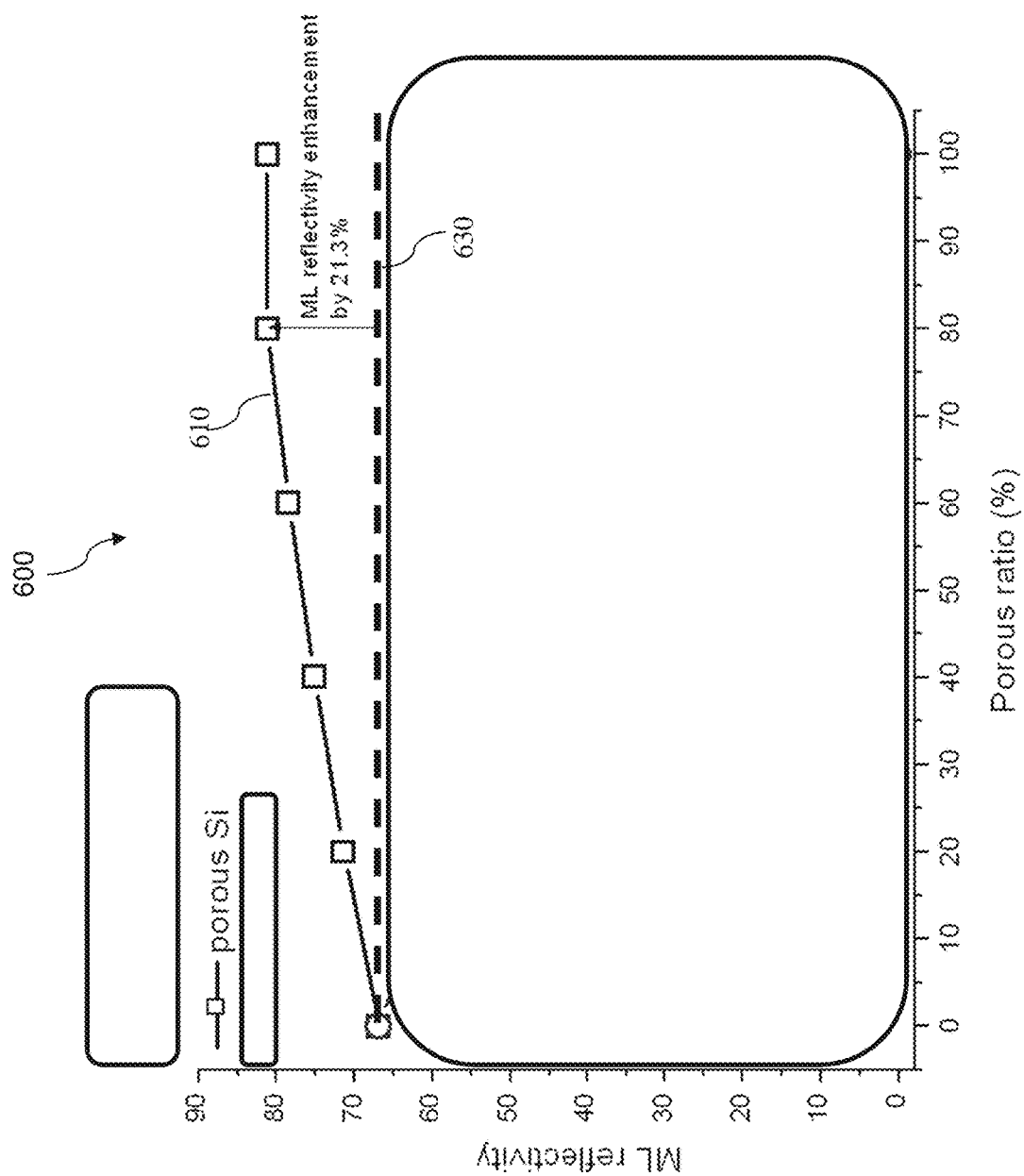
FIG. 5 is a graph illustrating a relationship between a reflectivity of a reflective multilayer structure and a porous ratio of the reflective multilayer structure in accordance with some embodiments of the present disclosure.

Referring now to FIG. 5, which is a graph 600 illustrating a relationship between a reflectivity of the reflective multilayer structure 34 and a porous ratio of the reflective multilayer structure 34 fabricated according to embodiments of the present disclosure. In more detail, the X-axis of the graph 600 represents a porous ratio (measured in %) of the porosity of the layer 120 (for example L/P as discussed above), and the Y-axis of the graph 600 represents the reflectivity (also measured in %) of the reflective multilayer structure 34. The graph 600 includes a plot 610, which includes a plurality of data points. Each data point in the plot 610 corresponds to a reflective multilayer structure 34 with a given porous ratio (e.g., X-coordinate) and the resulting reflectivity of the reflective multilayer structure 34 (e.g., Y-coordinate).

It can be seen from FIG. 5 that as the porous ratio increases, the resulting reflectivity of the reflective multilayer structure 34 also increases, until it plateaus around a porous ratio of about 80% and a reflectivity of about 80%. In other words, beyond about 80% for the porous ratio, the reflectivity does not change significantly. The graph 600 also includes a horizontal bar 630, which represents the reflectivity performance of a conventional multilayer reflective structure (i.e., a multilayer reflective structure that is not porous). Based on the example shown in FIG. 5, it can be seen that the embodiments shown in FIG. 5 can offer up to a reflectivity enhancement of about 21.3% compared to conventional multilayer reflective structures. Again, it is understood that FIG. 5 merely illustrates an example of the present disclosure regarding the reflectivity enhancement and therefore is not intended to be limiting. Other embodiments of the present disclosure can offer a different amount of reflectivity improvement, and/or the porous ratio VS reflectivity plot may have a different characteristic than the plot 610 shown in FIG. 5 as well.

Figure 6:
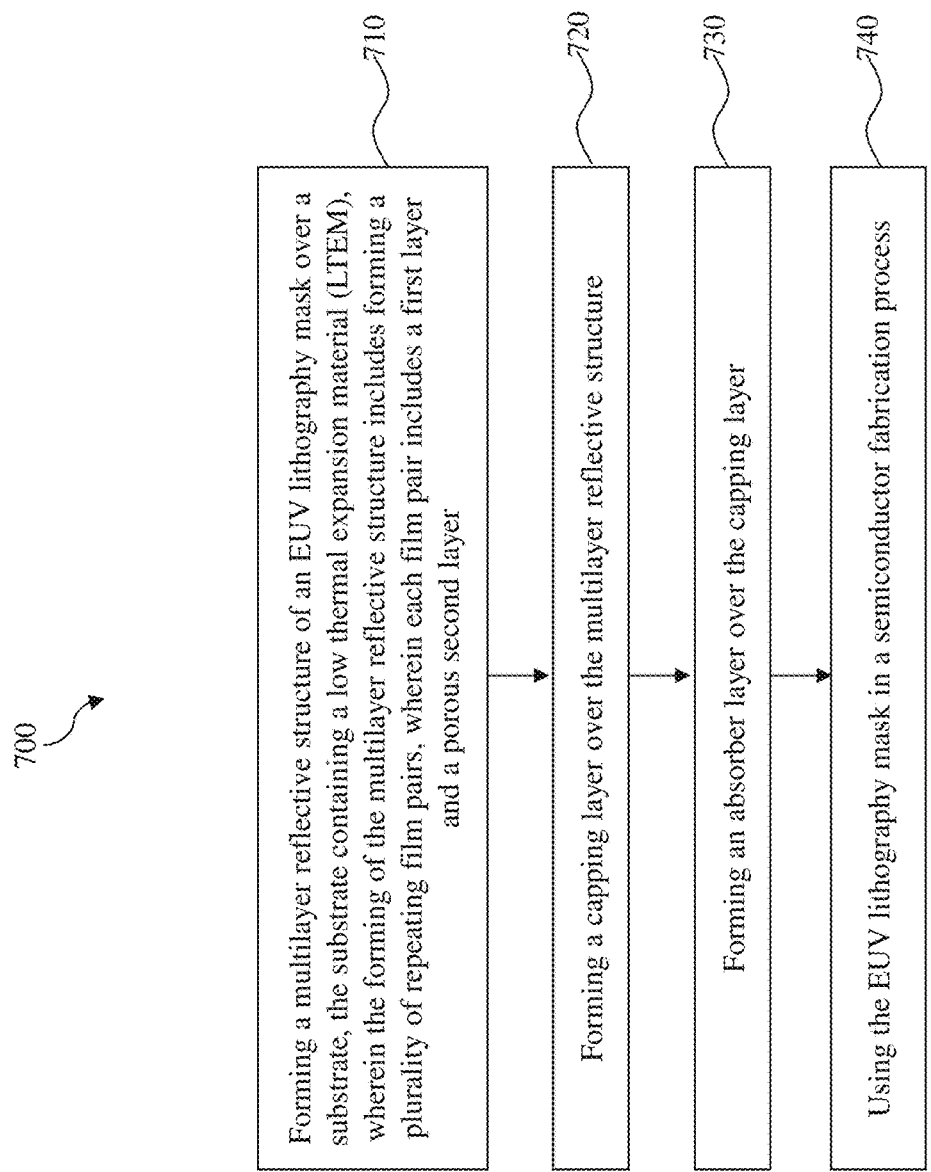
FIG. 6 is a flowchart of a method of manufacturing and using an EUV mask in accordance with some embodiments of the present disclosure.

FIG. 6 is a flowchart illustrating a simplified method 700. The method 700 includes a step 710 of forming a multilayer reflective structure over a substrate. The substrate contains a low thermal expansion material (LTEM). The LTEM substrate and the multilayer reflective structure are formed as portions of an EUV lithography mask. The forming of the multilayer reflective structure includes forming a plurality of repeating film pairs. In some embodiments, each film pair includes a first layer and a porous second layer.

In some embodiments, the forming of the multilayer reflective structure includes forming a molybdenum layer as the first layer and forming a porous silicon layer as the second layer. In these embodiments, a first molybdenum silicide ($MoSi_2$) layer may be formed between the first layer and the second layer, and a second $MoSi_2$ layer may be formed over the second layer.

In some embodiments, the first layer is formed to be free of pores, and the porous second layer is formed to have a plurality of pores or voids that vertically extend through the porous second layer. In some embodiments, the porous second layer is formed such that the pores have a periodic distribution. In some embodiments, the porous second layer is formed such that the pores have slanted profiles.

In some embodiments, the porous second layer is formed using a glancing angle deposition process. In other embodiments, the porous second layer is formed using ion beams. In further embodiments, the porous second layer is formed using one or more etching processes.

The method 700 includes a step 720 of forming a capping layer over the multilayer reflective structure. For example, a ruthenium capping layer may be formed over the multilayer reflective structure for protection.

The method 700 includes a step 730 of forming an absorber layer (also referred to as an absorption layer) over the capping layer. For example, the absorber layer is patterned to define a layer of an integrated circuit (IC).

The method 700 includes a step 740 of using the EUV lithography mask in a semiconductor fabrication process. For example, the EUV lithography mask may be used to pattern an EUV photoresist in an EUV lithography process.

It is understood that additional fabrication processes may be performed before, during, or after the steps 710-740 of FIG. 6. Other processes are not discussed in detail herein for reasons of simplicity.

Based on the above discussions, it can be seen that the present disclosure offers various advantages in EUV lithography. It is understood, however, that not all advantages are necessarily discussed herein, and other embodiments may offer different advantages, and that no particular advantage is required for all embodiments.

One of the advantages is that by making a multilayer reflective structure of a EUV lithography mask porous, the performance of the EUV lithography mask is improved. For example, the silicon layers in the multilayer reflective structure are formed to have gaps or voids therein. Since the voids approximate vacuum, which has a refractive index of 1 and an absorption coefficient of 0, the existence of the gaps or voids in the silicon layers effectively transform the silicon layers into a layer that offers a greater refractive index than silicon and a lower absorption coefficient than silicon. Having an increased refractive index and a decreased absorption coefficient is desirable for a multilayer reflective structure, since its primary purpose is to reflective radiation. Another advantage of the porous multilayer reflective structure of the present disclosure is that it reduces inter-diffusion between the film pairs in the multilayer reflective structure. For example, the portions of the silicon layer that are now voids will not form silicon/molybdenum interfaces with the molybdenum layer. The reduction in the silicon/molybdenum interface also translates into a reduction in inter-diffusion between the silicon and molybdenum layers, which in turn enhances the performance of the EUV lithography mask of the present disclosure.

One aspect of the present disclosure pertains to a lithography mask. The lithography mask includes a substrate that contains a low thermal expansion material (LTEM); and a reflective structure disposed over the substrate, wherein the reflective structure includes: a first layer and a second layer disposed over the first layer, and wherein at least the second layer is porous.

Another aspect of the present disclosure pertains to a method of performing a lithography process. The lithography process is performed using a lithography mask that includes: a substrate that contains a low thermal expansion material (LTEM); and a reflective structure disposed over the substrate, wherein the reflective structure includes a plurality of repeating pairs of a first layer and a second layer, and wherein a plurality of voids is disposed in the second layer but not in the first layer.

Yet another aspect of the present disclosure pertains to a method of fabricating a lithography mask. The method includes: forming a multilayer reflective structure over a substrate, the substrate containing a low thermal expansion material (LTEM), wherein the forming of the multilayer reflective structure includes forming a plurality of repeating film pairs, wherein each film pair includes a first layer and a porous second layer; forming a capping layer over the multilayer reflective structure; and forming an absorber layer over the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A lithography mask, comprising:
a substrate;
a first layer of a reflective structure disposed over the substrate; and
a second layer of the reflective structure disposed over the first layer;
wherein:
the first layer and the second layer have different material compositions;
the second layer includes a plurality of segments that are within the second layer, the segments being separated from one another by a plurality of gaps; and
at least some of the segments of the second layer each has a slanted sidewall.

2. The lithography mask of claim 1, wherein:
the first layer includes molybdenum; and the second layer includes silicon or a non-silicon material having a refractive index that is within a few percentage points of 1.

3. The lithography mask of claim 1, wherein the slanted sidewall and a top surface of the first layer define an angle that is in a range between about 20 degrees and about 70 degrees.

4. The lithography mask of claim 1, wherein:
the gaps each have a first horizontal dimension;
the segments each have a second horizontal dimension; and
a ratio between the first horizontal dimension and a sum of the first horizontal dimension and the second horizontal dimension is in a range between about 20% and about 90%.

5. The lithography mask of claim 4, wherein the ratio is in a range between about 40% and about 80%.

6. The lithography mask of claim 1, further comprising a silicide layer between the first layer and each of the segments of the second layer.

7. The lithography mask of claim 1, wherein the gaps have a periodic distribution.

8. The lithography mask of claim 1, wherein the first layer has a first material composition, wherein the second layer has a second material composition, and wherein the lithography mask further comprises:
a third layer of the reflective structure disposed over the second layer, wherein the third layer has the first material composition; and
a fourth layer of the reflective structure disposed over the third layer, wherein the fourth layer has the second material composition, wherein the fourth layer includes a plurality of segments that are separated from one another by a plurality of gaps, and wherein at least some of the segments of the fourth layer each has a slanted sidewall.

9. The lithography mask of claim 1, further comprising:
a capping layer disposed over the second layer;
a buffer layer disposed over the capping layer; and
a patterned absorber layer disposed over the buffer layer.

10. A method of performing a lithography process, comprising:
providing a lithography mask that includes a reflective structure, the reflective structure including a plurality of interleaving first layers and second layers, wherein the first layers are each substantially void-free, wherein the second layers each include a plurality of voids, and wherein at least some of the voids have slanted sidewalls; and
performing a lithography process using the lithography mask.

11. The method of performing the lithography process of claim 10, wherein the performing the lithography process includes performing an extreme ultraviolet (EUV) lithography process.

12. The method of performing the lithography process of claim 10, wherein the plurality of voids have a periodic distribution within each of the second layers.

13. The method of performing the lithography process of claim 10, wherein the reflective structure further includes silicide materials that are different from the first layers and different from the second layers.

14. The method of performing the lithography process of claim 10, wherein: the first layers each include molybdenum; and the second layers each include silicon.

15. A method of fabricating a lithography mask, comprising:
placing a substrate of the lithography mask over a vapor source;
performing a first deposition process to deposit a first layer over the substrate at least in part by releasing vapor from the vapor source without tilting the substrate, thereby forming the first layer to be substantially void-free;
performing a second deposition process to deposit a second layer over the first layer at least in part by releasing vapor from the vapor source while tilting the substrate at a first angle, thereby trapping gaps within the deposited second layer; and repeating the performing the first deposition process and the performing the second deposition process a plurality of times to form a multi-layer reflective structure that includes a plurality of alternating first layers and second layers.

16. The method of fabricating the lithography mask of claim 15, wherein the performing the second deposition process comprises releasing the vapor from the vapor source while rotating the substrate at a second angle.

17. The method of fabricating the lithography mask of claim 15, wherein the performing the first deposition process comprises depositing a molybdenum material as the first layer.

18. The method of fabricating the lithography mask of claim 15, wherein the performing the second deposition process comprises depositing a silicon material as the second layer.

19. The method of fabricating the lithography mask of claim 15, wherein the gaps trapped within the deposited second layer are formed to each have a slant angle.

20. The method of fabricating the lithography mask of claim 15, further comprising:
forming a capping layer over the multi-layer reflective structure;
forming a buffer layer over the capping layer; and
forming a patterned absorber layer over the buffer layer.

* * * * *